United States Patent
Mathesan et al.

(10) Patent No.: US 12,261,546 B2
(45) Date of Patent: Mar. 25, 2025

(54) INVERTER UNIT

(71) Applicant: Valeo Japan Co., Ltd., Saitama (JP)

(72) Inventors: Praveen Mathesan, Chennai (IN);
Prakash Ganesan, Chennai (IN);
Vigneshwar Narayanamoorthy,
Chennai (IN); Baskaran Raja, Chennai
(IN); Herve Ribot, Le Mesnil Saint
Denis (FR); Sangeetha Sethulingam,
Chennai (IN); Philippe Mercier,
Sable-sur-Sarthe (FR); **Saravanan
Balasundaram**, Chennai (IN)

(73) Assignee: Valeo Japan Co., Ltd., Saitama (JP)

( * ) Notice: Subject to any disclaimer, the term of this patent is extended or adjusted under 35 U.S.C. 154(b) by 192 days.

(21) Appl. No.: 18/187,301

(22) Filed: Mar. 21, 2023

(65) Prior Publication Data
US 2023/0299689 A1    Sep. 21, 2023

(30) Foreign Application Priority Data

Mar. 21, 2022 (IN) .............................. 202241015552

(51) Int. Cl.
*H02M 7/00* (2006.01)
*H02P 27/06* (2006.01)
*H05K 1/18* (2006.01)

(52) U.S. Cl.
CPC ............ *H02M 7/003* (2013.01); *H02P 27/06* (2013.01); *H05K 1/181* (2013.01)

(58) Field of Classification Search
CPC .... H02M 3/28; H02M 3/335; H02M 3/33569; H02M 3/33507; H02M 7/003; H02H 7/122; B60K 6/405; H01L 23/4093; H05K 1/0204; H05K 1/0209; H05K 2201/10166; H05K 7/20472; H05K 7/2049; H05K 7/20509; H05K 7/209; H05K 1/183; H05K 1/184; H05K 1/188; H05K 3/02; H05K 1/0243;
(Continued)

(56) References Cited

U.S. PATENT DOCUMENTS

2020/0381981 A1* 12/2020 Kobayashi ............... H05K 1/18

FOREIGN PATENT DOCUMENTS

EP    2 549 844 A1    1/2013
EP    4 187 091 A1    5/2023

OTHER PUBLICATIONS

Extended European Search Report issued in Corresponding EP Application No. 23 157 116.7, dated Aug. 7, 2023 (13 Pages).

* cited by examiner

*Primary Examiner* — Antony M Paul
(74) *Attorney, Agent, or Firm* — Osha Bergman Watanabe & Burton LLP

(57) ABSTRACT

An inverter unit includes an inverter and an inverter housing. The inverter drives an electric motor and includes at least one power module and a printed circuit board. The power module converts a High Voltage (HV) Direct Current (DC) to a three-phase Alternating Current (AC) that drives the electric motor. The power module includes lead frames to be received in apertures formed on the PCB. The PCB configured with electronic components mounted thereon controls the electric motor. The inverter housing includes a front head and a cover. The cover in conjunction with the front head defines an enclosure for receiving the inverter. The inverter unit includes support elements to support the power module in a hanging configuration with respect to the PCB.

17 Claims, 9 Drawing Sheets

(58) Field of Classification Search
CPC .......... H05K 1/11; H05K 13/00; H05K 13/04; H02P 27/06; H02P 27/08; H02P 27/04; H02K 47/04; B23K 1/00; H01R 12/00
See application file for complete search history.

INVERTER UNIT

TECHNICAL FIELD

The present invention relates to an inverter unit, more specifically, the present invention relates to an inverter unit for a compressor of a vehicle air-conditioning unit.

BACKGROUND

Generally, a motor-driven compressor for an air-conditioning system of a vehicle includes a compression unit for compressing refrigerant, an electric motor to drive the compression unit and an inverter unit. The motor driven compressor further includes a main housing also referred to as compressor housing to accommodate the compression unit and the electric motor and a separate inverter housing to accommodate the inverter unit.

The compressor housing is made of metal such as aluminium and is generally grounded. The inverter housing is also made of metal such as aluminium. The inverter housing includes a front head and a cover. The front head includes an end wall, a peripheral wall extending from the periphery of the end wall to define a Printed Circuit Board (PCB) accommodation space and an open end closable by a cover. The inverter housing is either integrally formed with the compressor housing or is separate housing assembled to the compressor housing. The inverter unit includes an inverter configured with a Printed Circuit Board, hereinafter, referred to as PCB and a power module both received inside the inverter housing. The PCB and the power module functionally coupled to the electric motor received in the main housing drive the electric motor in a controlled manner. In the assembled configuration of the inverter housing and the main housing, the PCB accommodation space is disposed adjacent to the electric motor receiving portion of the main housing. The power module generates heat during operation thereof. The heat generated may cause damage to the power module due to fusing of critical elements of the power module, breakage or failure of the power module due to reduced mechanical strength of critical elements thereof at elevated temperatures. To prevent the problems arising due to the heating of the power module, it is required to dissipate heat from the power module for preventing breakage or failure of the power module and ensuring efficient performance of the power module. As illustrated in FIG. 1, the power module 2 is urged against an end wall 4 of the front head of the inverter housing for heat dissipation from the power module 2. Particularly, the refrigerant received by the motor accommodating space of the main housing being in contact with the end wall 4 of the front head carries away the heat from the power module 2 urged against the end wall 4 to prevent heating of the power module 2.

Again referring to the FIG. 1 of the accompanying drawings, the power module 2 held inside the inverter housing and mounted on the end wall 4 of the inverter housing includes a plurality of switching elements that are molded in a casing of the power module 2. The switching elements include lead frames 3 that protrude out of the casing of the power module 2 and are connected with the PCB 1, so that DC high voltage power, low voltage signals and AC output can be supplied to corresponding portions in the PCB 1. The power module 2 is mounted on and urged against the end wall 4 of the front head by means of metal bolts 6. Referring to the FIG. 1, the power module 2 is urged against the end wall 4 of the front head by means of bolts 6. The casing of the power module 2 includes cut-outs 8 formed on opposite sides thereof, through which the bolts 6 pass and engage with end wall 4 of the front head. Generally, the power module 2 is disposed at a proper position by being restricted by any positioning means such as positioning jig or pin when the power module 2 is fixed by the bolts 6. However, even the position of the power module 2 is restricted by the positioning means, it may deviate along B-B' direction as illustrated in FIG. 2 due to an unavoidable clearance between the positioning means and the power module 2. Further, the PCB 1 is mounted on the front head 4 after the power module 2 is fixed on the end wall 4a of front head 4 as illustrated in FIG. 3. The position of the PCB 1 mounted on the front head 4 is also restricted by some positioning means, but may be deviated along A-A' direction as illustrated in FIG. 2 due to unavoidable clearances between the positioning means and the PCB 1. Due to the combined effect of these deviated lateral positions, sufficient clearance is required to be provided between the lead frames 3 and the corresponding apertures 1a formed on the PCB 1 for receiving the lead frames 3. If the clearance between the lead frames 3 and the corresponding apertures 1a is not sufficient, there is a risk that the lead frames 3 are not properly received in the apertures 1a formed on the PCB 1.

Considering the dimension of the lead frames cannot be reduced beyond a particular extent, the dimension of the apertures 1a is increased in order to achieve sufficient clearance between the lead frames 3 and the corresponding apertures 1a formed on the PCB 1. The lead frames 3 passing through the apertures 1a extend out from other side of the PCB 1 and are secured to the PCB 1 by soldering. Specifically, soldering pads are disposed around the apertures 1a formed on the PCB 1 to define soldering site that facilitate soldering connection between the lead frames 3 and the PCB 1. However, due to fixed spacing between the apertures 1a, because of fixed spacing between the lead frames 3 and large dimension of apertures 1a lead to reduced gap between the soldering pads, there are chances of formation of soldering bridge at adjacent soldering sites. The soldering bridge is undesirable and causes many problems, such as short circuit between the soldering pads at the adjacent soldering sites during soldering of the lead frames 3 to the PCB 1. The short-circuiting may cause part defects and lead to part rejection.

This problems such as for example, soldering bridge formation at the soldering sites resulting from the large deviation of the lateral positions of the power module 2 and the PCB 1 might be able to be avoided by changing the assembly sequence of the inverter unit.

Accordingly, there is a need for an inverter unit that obviates the drawbacks associated with conventional inverter unit, particularly, problems caused by formation of soldering bridge at adjacent soldering sites, such as for example, short circuit during soldering of lead frames emanating from a power module with a PCB. Further, there is a need for a method of assembly for an inverter unit that requires fewer loose parts during the assembly thereof, thereby reducing the chances of disengagement of elements of sub-assembly and resulting in convenient assembly

OBJECTS

An object of the present invention is to provide an inverter unit that obviates the drawbacks associated with conventional inverter unit and problems associated with assembly of the conventional inverter unit, particularly, problems of solder bridge formation and short circuit during soldering of lead frames to a PCB resulting from the power module assembled to the front head before the PCB is assembled in the front head.

Another object of the present invention is to provide an inverter unit that involves an assembly sequence with fewer loose parts during assembly that enables holding together of elements of sub-assembles thereof, during the assembly thereof.

Yet another object of the present invention is to provide an assembly method for am inverter unit that is quick and convenient and efficient that involves fewer rejection rates.

Still another object of the present invention is to provide an inverter unit that simple in construction and reliable.

In the present description, some elements or parameters may be indexed, such as a first element and a second element. In this case, unless stated otherwise, this indexation is only meant to differentiate and name elements which are similar but not identical. No idea of priority should be inferred from such indexation, as these terms may be switched without betraying the invention. Additionally, this indexation does not imply any order in mounting or use of the elements of the invention.

SUMMARY

An inverter unit is disclosed in accordance with an embodiment of the present invention. The inverter unit includes an inverter and an inverter housing. The inverter drives an electric motor and includes at least one power module and a Printed Circuit Board, hereinafter referred to as PCB. The power module converts a High Voltage (HV) Direct Current (DC) to a three-phase Alternating Current (AC) that drives the electric motor. The power module further includes lead frames emanating therefrom. The PCB configured with a plurality of electronic components mounted thereon controls the electric motor. The PCB includes apertures formed there-through to receive the corresponding lead frames. The inverter housing includes a front head and a cover. The front head includes an end wall and a peripheral wall. The cover in conjunction with the front head defines an enclosure for receiving the inverter. The inverter unit further includes a plurality of support elements to support the power module in a hanging configuration with respect to the PCB to define a printed circuit board sub-assembly.

Further, the inverter unit includes a separator element of insulating material, assembled to under-side of the PCB facing the end wall of the front head to form the printed circuit board sub-assembly.

Particularly, the separator element separates the electronic components mounted on underside of the PCB with respect to each other.

Further, the separator element includes at least one of apertures, passages and cut-outs aligned with the apertures formed on the PCB and to permit passage of the lead frames there-through.

In accordance with an embodiment of the present invention, the support elements are depending from the separator element and are adapted to prevent the power module from falling into the front head during placing of PCB sub-assembly inside the front head.

Alternatively, the support elements are emanating from power module and extending towards the separator to engage there-with.

Particularly, the power module includes cut-outs that are aligned to second holes and passages formed on the PCB and separator element respectively to permit passage of bolts there-through for mounting the power module of the PCB sub-assembly to the end wall.

In accordance with an embodiment of the present invention, the support elements are depending from the PCB.

Alternatively, the support elements are emanating from the power module and extending towards the PCB to engage there-with.

In another embodiment of the present invention, the power module includes cut-outs that are aligned to second holes formed on the PCB to permit passage of bolts there-through for mounting the power module of the PCB sub-assembly to the end wall.

Generally, the power module includes either one of a rib and a groove disposed either intermittently or continuously along at least a portion of periphery of the power module that engages with support elements.

Preferably, at least one of the support elements includes a hook portion that supports the power module.

Also is disclosed a method of assembly for an inverter unit that includes inverter configured with a PCB and a power module received inside an inverter housing. The inverter housing includes a front head and a cover. The method includes the step of inserting lead frames emanating from a power module into corresponding apertures formed on the PCB to form a PCB sub-assembly. Thereafter, the method involves the step of inverting the PCB sub sub-assembly so that the power module of the PCB sub-assembly is in a hanging configuration thereof with respect to the PCB. The method involves, simultaneously supporting the power module of the inverted PCB sub-assembly by support elements. Subsequently, the method involves the step of placing inverted PCB sub-assembly inside the front head of an inverter housing, wherein the support elements prevent the power module of the PCB sub-assembly from falling over an end wall of the front head. Thereafter, the method involves the step of assembling the PCB of the PCB sub-assembly to the front head by means of screws passing through first holes formed on the PCB. Thereafter, the method involves the step of securely mounting the power module of the PCB sub-assembly to the end wall of the front head by means of bolts to urge the power module against the end wall. Subsequently, the method involves the step of forming soldering connection between the lead frames and the PCB. Finally, the method involves the step of mounting a cover for closing an open end of the front head by means of screws.

More specifically, the step of supporting the power module of the inverted PCB sub-assembly involves supporting the power module by the support elements depending from the PCB.

Optionally, the method of assembly of the inverter unit involves the step of assembling a separator element of insulating material to under-side of the PCB facing the end wall of the front head before receiving lead frames emanating from the power module inside corresponding apertures formed on the PCB.

Further, the method optionally involves the step of supporting the power module of the inverted PCB sub-assembly by the support elements depending from the separator element.

BRIEF DESCRIPTION

Other characteristics, details and advantages of the invention can be inferred from the description of the invention hereunder. A more complete appreciation of the invention and many of the attendant advantages thereof will be readily obtained as the same becomes better understood by reference to the following detailed description when considered in connection with the accompanying figures, wherein.

DETAILED DESCRIPTION

The present invention is described with example of inverter unit for a motor-driven compressor of a vehicle air-conditioning system. However, the present invention is also applicable to any electronic system used in vehicular and non-vehicular applications to achieve ease of assembly of sub-components or sub-assembly thereof.

Figure 4:
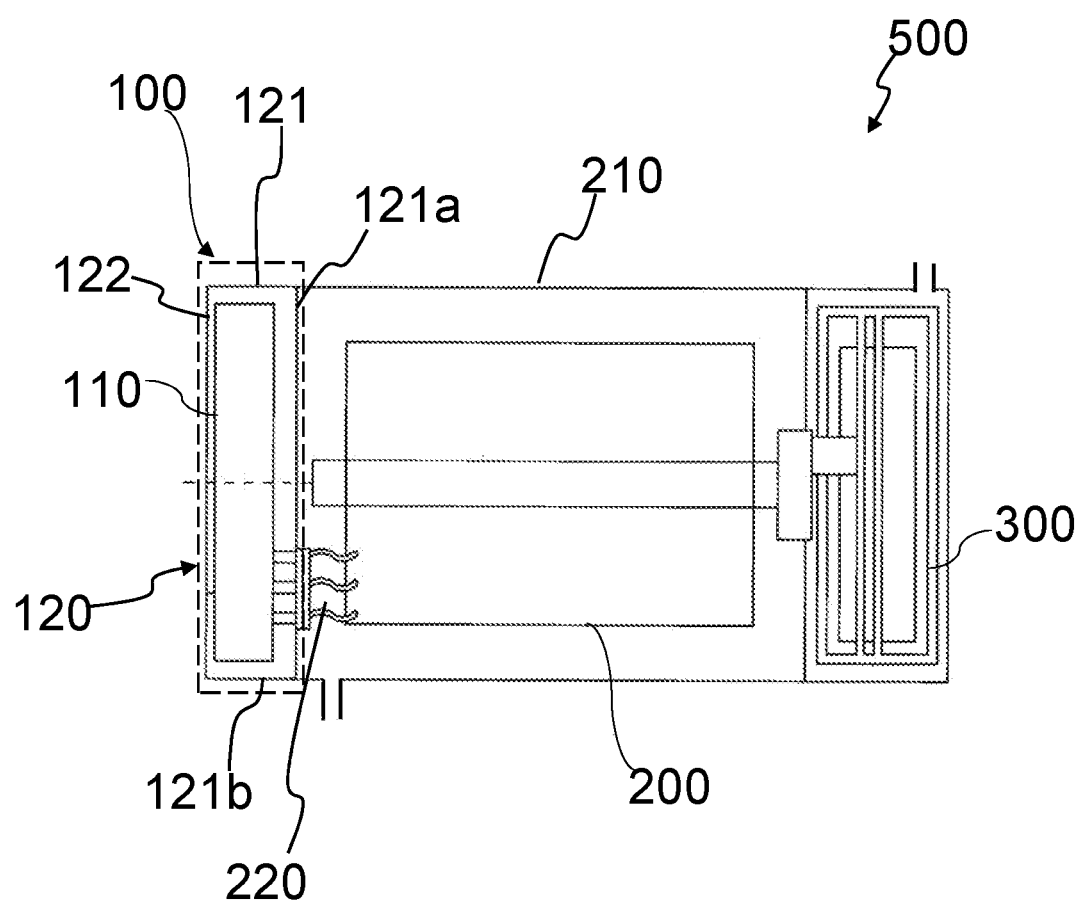
FIG. 4 illustrates a schematic representation of a motor-driven compressor for an air-conditioning system of the present invention.

FIG. 4 illustrates a schematic representation of a motor-driven compressor 500 for a vehicle air-conditioning system in accordance with an embodiment of the present invention. The motor-driven compressor 500 includes an inverter unit 100, an electric motor 200 and a compression unit 300 driven by the electric motor 200 for compressing refrigerant. The motor driven compressor 500 further includes a main housing also referred to as compressor housing 210 and an inverter housing 120. The inverter housing 120 is either integrally formed with the compressor housing 210 or is separate housing assembled to the compressor housing 210. The main housing or the compressor housing 210 accommodates the electric motor 200 and the compression unit 300. The inverter housing 120 accommodates an inverter 110. The compressor housing 210 is made of metal such as aluminium and is generally grounded to the vehicle via a mounting portion (not shown).

The inverter housing 120 includes a front head 121 and a cover 122. The front head 121 includes an end wall 121a, a peripheral wall 121b extending from the periphery of the end wall 121a to define a PCB accommodation space and an open end of the inverter housing 120. The inverter housing 120 is connected to the main housing 210 and the inverter housing 120 is also grounded via the compressor housing 210. The open end of the front head 121 is closable by the cover 122. The inverter 110 is functionally coupled to the electric motor 200 received in the main housing 210 to drive the electric motor 200 in a controlled manner. The PCB accommodation space is disposed adjacent to the electric motor receiving portion of the main housing 210 when the inverter housing 120 is assembled to the main housing 210 and the inverter 110 is functionally connected to the electric motor 200 via an electrical connection interface provided through the end wall 121a. With such configuration of the PCB accommodating space and the electric motor receiving portion of the main housing 210 are disposed adjacent to each other. Accordingly, the cooling fluid, particularly, the refrigerant received in the motor receiving portion also cools the end wall 121a as the end wall 121a of the front head 121 of the inverter housing 120 is in contact with the main housing 210 cooled by the refrigerant.

Figure 5:
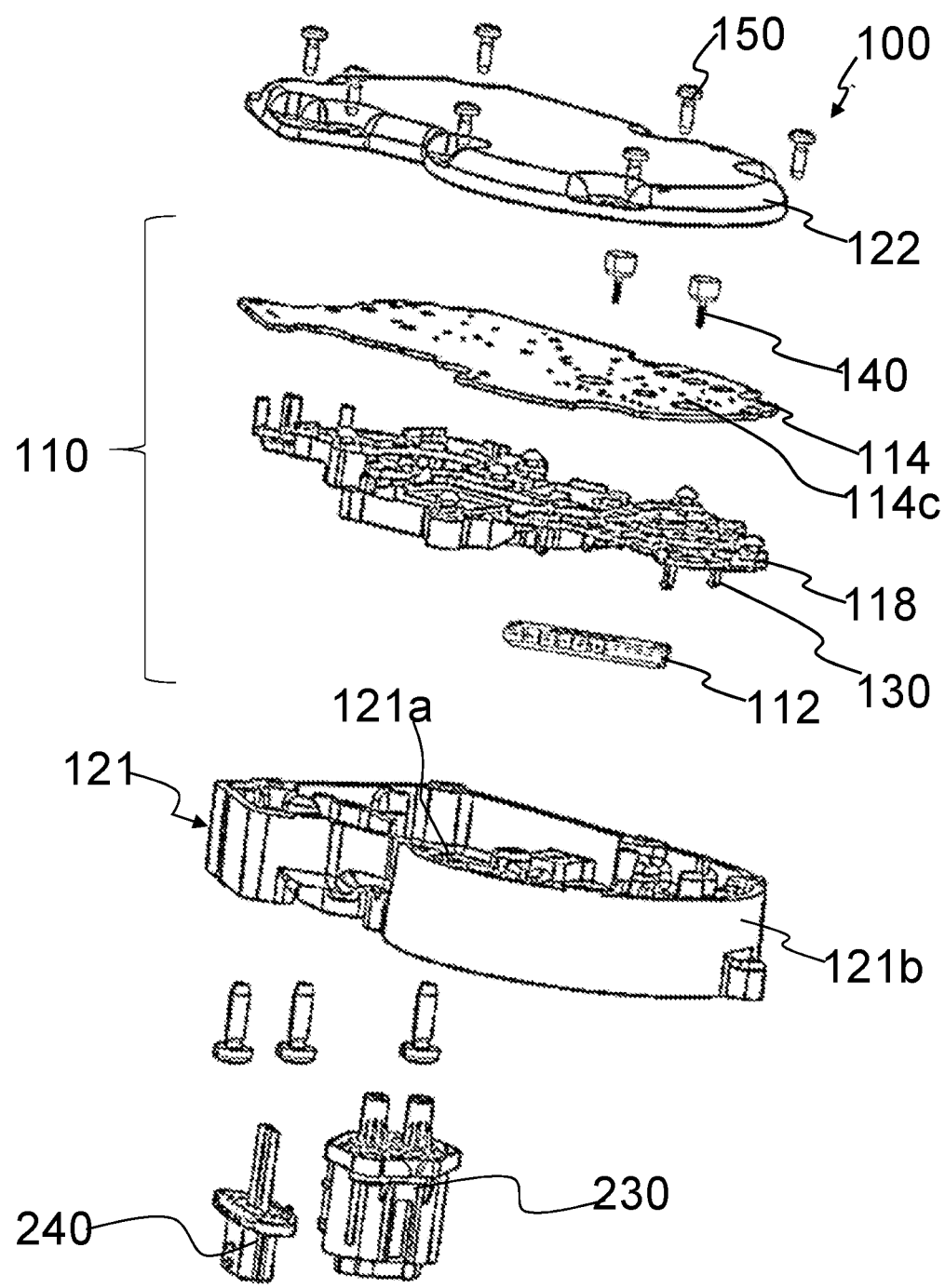
FIG. 5 illustrates an exploded view of an inverter unit of the motor-driven compressor of FIG. 4 depicting a power module, a PCB, a separator element and a bolt assembly of the inverter unit.

FIG. 5 of the accompanying drawings illustrates an exploded view of the inverter unit 100 of one embodiment. The inverter unit 100 is composed of the inverter housing 120 and the inverter 110 accommodated in the inverter housing 120. Further, the inverter unit 100 includes a High Voltage (HV) connector 230 and a Low Voltage (LV) connector 240 disposed on the end wall 121a of the inverter housing 120 to receive high voltage power supply and control signal from the vehicle systems. The inverter 110 drives the electric motor 200. The inverter 110 includes at least one power module 112 and a Printed Circuit Board, hereinafter referred to as PCB 114. The power module 112 converts a High Voltage (HV) Direct Current (DC) to a three-phase Alternating Current (AC) that drives the electric motor 200. The power module 112 generates heat during operation thereof and is required to be cooled. The power module 112 is urged against the end wall 121a of the front head 121 by means of bolts 140 to cause cooling of the power module 112 by the inverter housing 120 cooled by the refrigerant in the motor receiving portion. The PCB 114 includes a plurality of electronic components disposed thereon to control operation of the electric motor 200.

Figure 6:
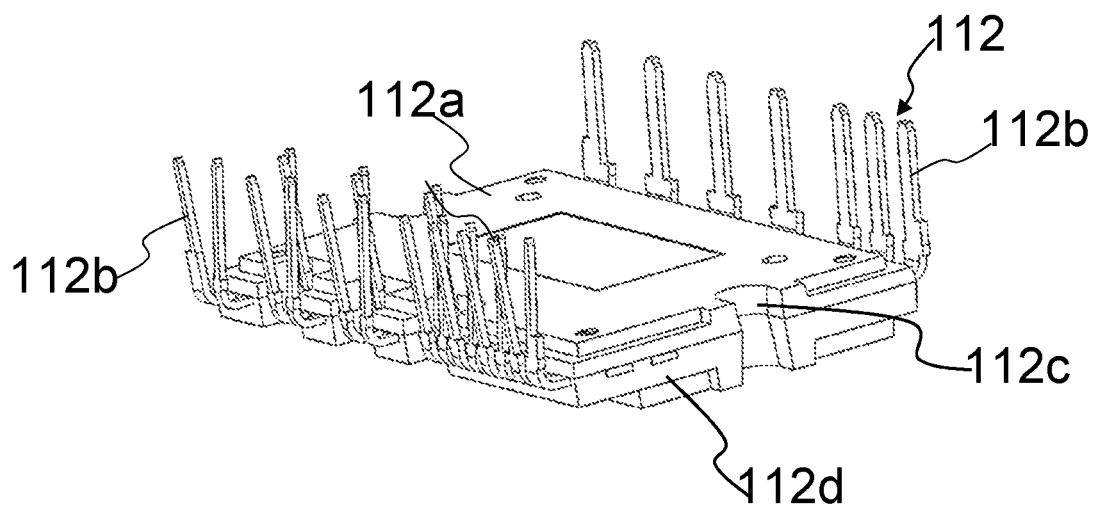
FIG. 6 illustrates an isometric view of the power module of the inverter unit of FIG. 5.

FIG. 6 illustrates an isometric view of the power module 112 of an embodiment. The power module 112 includes a casing 112a which has a shape of a rectangular box. The casing 112a is made of non-conductive material such as resin. A plurality of switching elements are disposed inside and covered by the casing 112a of the power module 112. Specifically the switching elements are molded in the casing 112a formed of resin material. A plurality of lead frames or pins 112b which conductively connect the switching elements extend out of the casing 112a from opposite longer sides of the casing 112a of rectangular configuration. The lead frames or pins 112b are made of conductive material such as copper. In accordance with one embodiment depicted in the FIG. 6, seven lead frames 112b extend out from a first longer side of the casing 112a and twenty lead frames or pins 112b extend out from a second longer side of the casing 112a, wherein the second longer side is opposite to the first longer side. The lead frames or pins 112b are bend at right angle so as to be able to be connected to the PCB 114 such that the power module 112 and the PCB 114 are disposed parallel to each other. Particularly, the free ends of the lead frames 112b are received in apertures 114a formed on the PCB 114 and soldered to the PCB 114. High voltage power from the vehicle battery is supplied to the switch elements via some of the lead frames or pins 112b. Further control signal is supplied to the switching elements via the other of the lead frames or pins 112b, hence the power module 112 can convert direct current (DC) to alternating current (AC). The casing 112a of the power module 112 further includes cut outs 112c formed on opposite shorter sides thereof for the passage of the bolts 140 for mounting the power module 112 on the end wall 121a of the front head 121. Generally, the cut-outs 112c are disposed at the centre of the shorter sides of the casing 112a. The cut-outs 112c are aligned to either one of second holes 114c and passages 118b formed on the PCB 114 and a separator element 118 respectively to permit passage of the bolts 140 there-through for mounting the power module 112 of a PCB sub-assembly 113 or a PCB sub-assembly 113a in accordance with another embodiment to the end wall 121a. The PCB sub-assembly 113 is configured with the PCB 114 and the power module 112, whereas the PCB sub-assembly 113a includes the separator element 118 in addition to the PCB 114 and the power module 112, particularly, the separator element 118 is secured to the underside of the PCB 114. The PCB sub-assembly 113 can also be referred to as PCB—power module sub-assembly 113, whereas the PCB sub-assembly 113a in accordance with another embodiment can also be referred to as the PCB—separator element—power module sub-assembly 113a.

Figure 10:
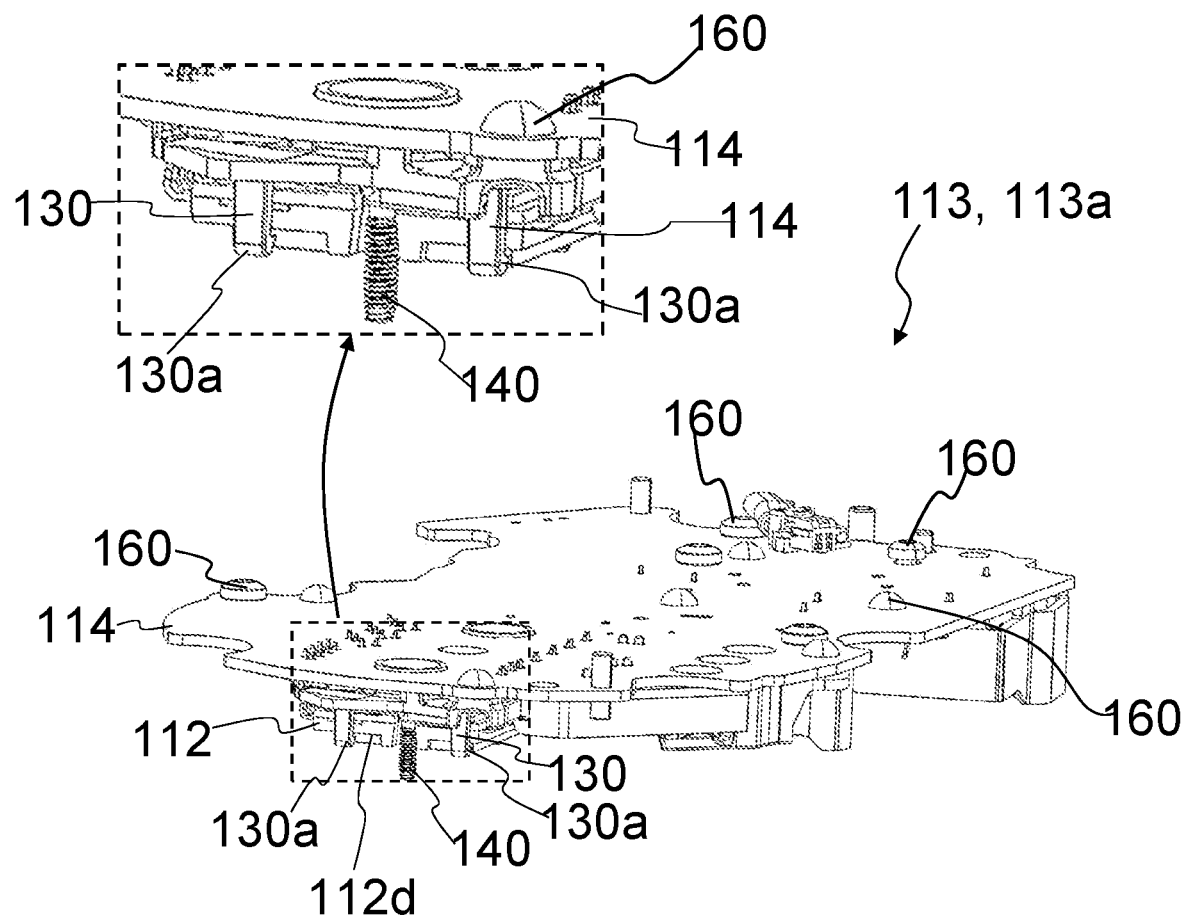
FIG. 10 illustrates hook formed on the support element engaging with rib formed on the power module to support the power module, also is illustrated enlarged view.

The power module 112 further includes at least one of a rib and/or a groove 112d disposed either intermittently or continuously along at least a portion of periphery of the power module 112 that engages with support elements 130. At least one of the support elements 130 includes a hook portion 130a that supports the power module 112. FIG. 10 illustrates hook 130a formed on the support element 130 engaging with the rib or groove 120d formed on the power module 112 to support the power module 112 in hanging configuration with respect to the PCB 114.

The conventional inverter unit involves an assembly sequence wherein the PCB is mounted on the front head by means of screws after the power module is mounted on the end wall of front head by means of bolts. Further, in such conventional configuration of the inverter unit, the PCB apertures receive the lead frames emanating from the power module after the power module is mounted on the end wall of the front head, and finally the lead frames are soldered to the PCB. Generally, the power module is disposed at proper position by being restricted by a positioning means for the power module such as positioning jig or pin when the power module is fixed by the bolts. The position of the PCB mounted on the front head is also restricted by some positioning means for the PCB. With such configuration, there are chances of soldering defects such as soldering bridge formation at the soldering sites due to excess clearance between the lead frames and the PCB apertures provided to accommodate the independent lateral movement of the PCB and the power module. The unrestricted lateral movement of the PCB in the A-A' direction is caused to due to unavoidable clearances between the positioning means for the PCB and the PCB and due to clearance between screws for mounting the PCB on the front head and the mounting holes formed on the PCB. The unrestricted lateral movement of power module in the lateral direction is due to clearance between the positioning means for the power module and the power module itself and clearance between the shaft portion of the bolt and the inside walls of the corresponding cut-outs of the power module. The problems of soldering defects could be avoided, if the lead frames of the power module could be inserted into the apertures formed on the PCB by assembling the power module on the PCB provisionally before the power module and the PCB are mounted on the front head. However, it would not be possible since the power module would drop off from the PCB when the PCB is inverted for being mounted on the front head. Further, it would not be possible to fix the power module to the end wall by screwing the bolts as the PCB covers the power module.

Figure 7:
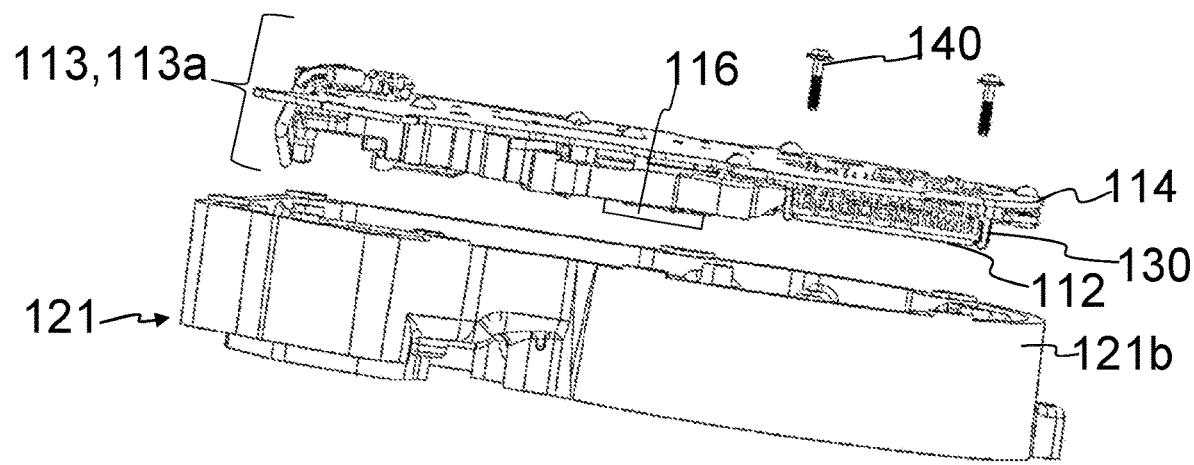
FIG. 7 illustrates an exploded view depicting mounting of a PCB sub-assembly over a front head of an inverter housing of the inverter unit of FIG. 5.

The inverter unit 100 of the present invention resolves the problems faced by the conventional inverter unit by changing the assembly sequence. Particularly, a plurality of support elements 130 supports the power module 112 in a hanging configuration with respect to the PCB 114 to prevent the power module 112 from falling into the front head 121 during placing of the inverted PCB sub-assembly 113 or the inverted PCB sub-assembly 113a inside the front head 121. In case of the inverter 110 of the present invention, the power module 112 is supported in a hanging configuration with respect to the PCB 114 to define the PCB sub-assembly 113. Preferably, the power module 112 is supported in the hanging configuration with respect to the separator element 118 of a PCB—separator element assembly 119 to define the PCB sub-assembly 113a as illustrated in FIG. 7. Thereafter, the inverted PCB sub-assembly 113 or the inverted PCB sub-assembly 113a is assembled to the end wall 121a of the front head 121 by mounting the power module 112 of the PCB sub-assembly 113 or the PCB sub-assembly 113a to the end wall 121a by means of the bolts 140 as illustrated in FIG. 7.

In accordance with a preferred embodiment, the separator element 118 of insulating material is assembled to underside of the PCB 114 facing the end wall 121a of the front head 121 as the PCB sub-assembly 113a is being placed inside the front head 121 to define the PCB—separator element sub-assembly 119. In such configuration, the separator 118 is disposed between the PCB 114 and the end wall 121a. The separator element 118 separates the electronic components mounted on the PCB 114 with respect to each other. In accordance with the preferred embodiment of the present invention, the support elements 130 are depending from the separator element 118 and supports the power module 112 in hanging configuration with respect to the separator element 118 while the PCB sub-assembly 113a is being placed inside the front head 121. Alternatively, the support elements 130 are emanating from the power module 112 and extending towards to engage with the separator element 118 to support the power module 112 in the hanging configuration with respect to the separator element 118. Such configuration of the support elements 130 prevent the power module 112 from falling into the front head 121 during placing of the PCB sub-assembly 113a inside the front head 121. With such configuration, the power module 112 is indirectly supported by the PCB 114 via the separator element 118 and any damage to the PCB 114 due to stresses being transmitted to the PCB 114 through the support elements 130 during mounting of the power module 112 to the end wall 121a by means of the bolts 140 is prevented. The separator element 118 includes at least one of apertures, passages and cut-outs 118a that are aligned to apertures 114a formed on the PCB 114. The apertures, passages and cut-outs 118a formed on the separator element 118 permit passage of the lead frames 114b there-through. Particularly, the lead frames 112b emanating from the power module 112 pass through the apertures, passages and cut-outs 118a formed on the separator element 118 and are subsequently received in the apertures 114a formed on the PCB 114 to configure the PCB sub-assembly 113a. In accordance with another embodiment, the support elements 130 are depending from the PCB 114 to support the power module 112 in the hanging configuration with respect to the PCB 114. Alternatively, the support elements 130 are emanating from the power module 112 and extending towards the PCB 114 to engage with the PCB 114 to support the power module 112 in the hanging configuration with respect to the PCB 114. The at least one of the support elements 130 includes a hook portion 130a over which the power module 112 rests, while the PCB sub-assembly 113a is being placed inside the front head 121 in inverted configuration thereof with the power module 112 disposed under the PCB 114. The support elements 130 are generally so placed to stably support the power module 112 from different sides.

In accordance with an embodiment of the present invention, the support elements 130 are formed with snap fit engagement elements 130a at the extreme ends thereof so that the power module 112 has to pressed against the snap fit engagement elements 130a to cross the snap fit engagement element to define the PCB sub-assembly 113. The power module 112 of the PCB sub-assembly 113 is supported by the snap fit engagement elements 130a to define the hanging configuration of the power module 112 with respect to the PCB 114 when the PCB sub-assembly 113 or the PCB sub-assembly 113a is inverted or held upside down. In such configuration, the support elements 130 only support the power module 112 without gripping or holding power module 112. With such configuration any damage to the PCB 114 due to stresses being transmitted to the PCB 114 through the support elements 130 during mounting of the power module 112 to the end wall 121a is prevented. However, the present invention is not limited to any particular configuration, number and placement of the support elements and whether support elements is emanating from the PCB or the separator element, as far as the support elements are capable of stably supporting the power module in the hanging configuration with respect to the PCB to prevent the power module from falling in the front head during placing of the PCB-power module sub-assembly in the inverter housing.

After the power module 112 is supported by the support elements 130 to configure either the PCB sub-assembly 113 or configure the PCB sub-assembly 113a, the power module 112 is mounted on the end wall 121a of the inverter housing 120. The PCB 114 and the separator element 118 also includes aligned apertures 114d and 118c respectively for passage of positioning jig there through. The positioning jig urges the power module 112 against the end wall 121a of the front head 121 with gap filler disposed between the power module 112 and the end wall 121a to ensure sufficient contact there between as the power module 112 is mounted on the end wall 121a by means of the bolts 140. The end wall 121a of the front head 121 of the inverter housing 120 is formed with holes to receive and configure threaded engagement with corresponding threaded portions of the bolts 140. In one embodiment, the holes formed on the end wall 121a are blind holes without threads formed thereon and the bolts 140 are self-tapping bolts that form threads on the holes as the bolts 140 are deployed. Alternatively, holes are threaded holes and the bolts 140 are screwed into the threaded holes to urge the power module 112 against the end wall 121a of the inverter housing 120 to improve a surface contact between the power module 112 and the end wall 121a and enhance the heat dissipation from the power module 112. For mounting the power module 112 of the PCB sub-assembly 113 over the end wall 121a of the front head 121, the cut-outs 112c formed on the power module 112 are aligned to the second holes 114c formed on the PCB 114 to permit passage of the bolts 140 there-through. For mounting power module 112 of the PCB sub-assembly 113a over the end wall 121a of the front head 121, the cut-outs 112c formed on the power module 112 are aligned to the second holes 114c and passages 118b formed on the PCB 114 and the separator element 118 respectively to permit passage of the bolts 140 there-through.

Further, with such configuration of the support elements 130, the power module 112 can hang either directly with respect to the PCB 114 to define the PCB sub-assembly 113 or hang from the separator element 118 to define the PCB sub-assembly 113a before being mounted to the end wall 121a. Specifically, the power module 112 is securely held in hanging configuration without danger of the power module 112 falling into the front head 121 while the PCB sub-assembly 113 or the PCB sub-assembly 113a is being placed in the front head 121. Accordingly, the lead frames 112b can be received in the PCB apertures 114a while the power module 112 is still not mounted to the end wall 121a. Particularly, the clearance between the lead frames 112b and the apertures 114a is no longer impacted by unrestricted lateral movement of the PCB 114 and the problem of excess clearance and problems arising due to excess clearance between lead frames 112b and the corresponding apertures 114a is avoided. Particularly, with such configuration, solder bridge formation between adjacent solder sites and problem of short-circuiting due to solder bridge formation is avoided.

Figure 8:
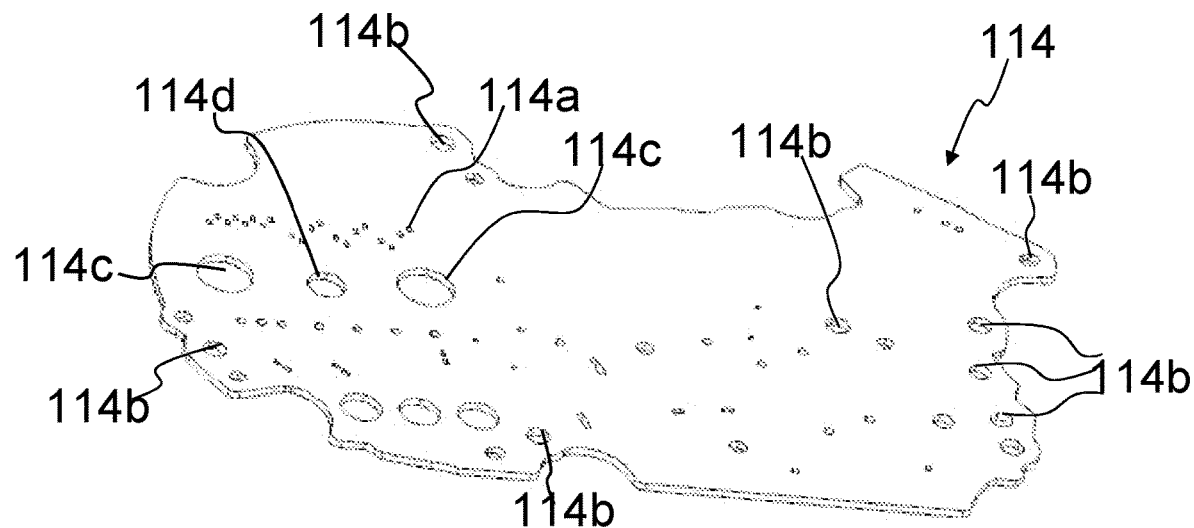
FIG. 8 illustrates an isometric view of the PCB of the inverter unit of FIG. 5.
Figure 9:
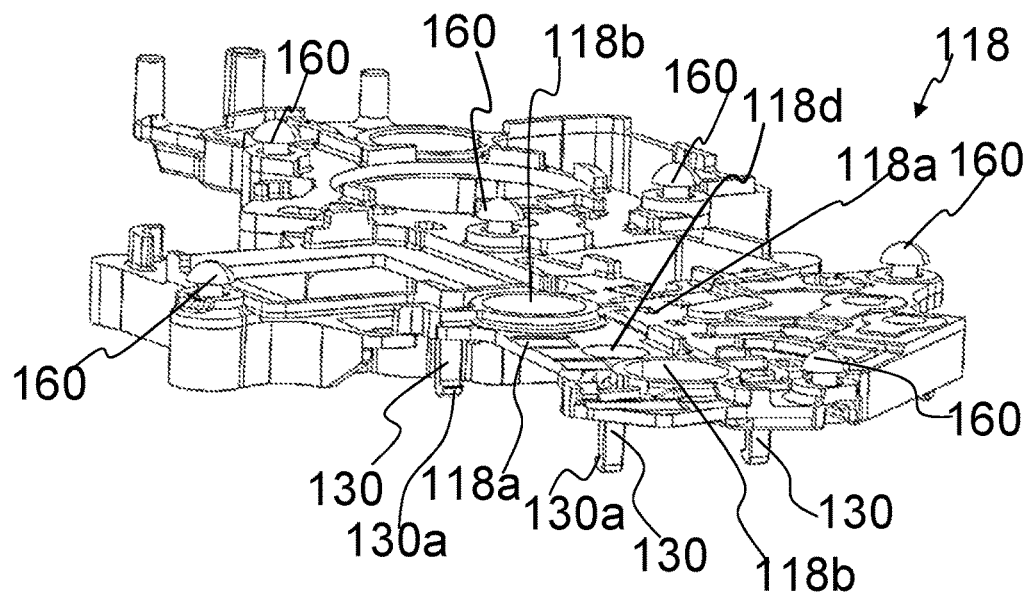
FIG. 9 illustrates an isometric view of the separator for the inverter unit of FIG. 5.

Also is disclosed a method 1000 of assembling an inverter unit 100 in accordance with an embodiment of the present invention. The inverter unit includes inverter configured with a PCB 114 and a power module 112 received inside an inverter housing 120. The inverter housing 120 includes a front head 121 and a cover 122. The method 1000 includes the step of inserting the lead frames 112a emanating from a power module 112 inside corresponding apertures 114a formed on a PCB 114 to form a PCB sub-assembly 113. Thereafter, the method 1000 involves the step of inverting the PCB sub-assembly 113 so that the power module 112 of the PCB sub-assembly 113 is disposed in a hanging configuration with respect to the PCB 114. Simultaneously, the method 1000 involves the step of supporting the power module 112 of the inverted PCB sub-assembly 113 by the support elements 130. Subsequently, placing the inverted PCB sub-assembly 113 inside the front head 121 of the inverter housing 120, wherein the support elements 130 prevents the power module 112 from falling over an end wall 121a of the front head 121. Thereafter, the method 1000 involves the step of assembling the PCB 114 of the PCB sub-assembly 113 to the front head 121 by means of screws 160 depicted in FIG. 9 passing through first holes 114b formed on the PCB 114 depicted in FIG. 8. There can be several mounting holes 114b formed on the PCB 114 for securely mounting of the PCB 114 to the front head 121, however, only a few of the mounting holes are labelled. The method 1000 further involves the step of securely mounting the power module 112 of the PCB—sub-assembly 113 to the end wall 121a of the front head 121 by means of the bolts 140 to urge the power module 112 of the PCB sub-assembly 113 against the end wall 121a. Subsequently, the method 1000 involves the step of forming soldering connection between the lead frames 112a and the PCB 114. The soldering connection is wave soldering. Finally, the method 1000 involves the step of mounting the cover 122 over the front head 121 for closing an open end of the front head 121 by means of screws 150. The method further involves additional steps such as forming gluing connection between the PCB 114 and the front head 121, curing of the glue, dispensing gap filler between the power module 112 and end wall 121a of the front head 121 and other steps like plasma treatment. Pressing the power module against the end wall 121a. The various steps of the method 1000 disclosed above can be combined in any order or can be performed in parallel to employ the method 1000, or an alternative method. Additionally, individual steps of the method 1000 can be altered or deleted without departing from the scope and ambit of the present invention.

The step of supporting the power module 112 of the inverted PCB sub-assembly 113 involves supporting the power module 112 by the support elements 130 depending from the PCB 114.

The method 1000 optionally involves the step of assembling a separator element 118 of insulating material to under-side of the PCB 114 facing the end wall 121a of the front head 121 before receiving the lead frames 112a emanating from the power module 112 inside the corresponding apertures 114a formed on the PCB 114.

The method 1000 optionally involves the step of supporting the power module 112 of the inverted PCB sub-assembly 113a by the support elements 130 depending from the separator element 118.

Figure 1:
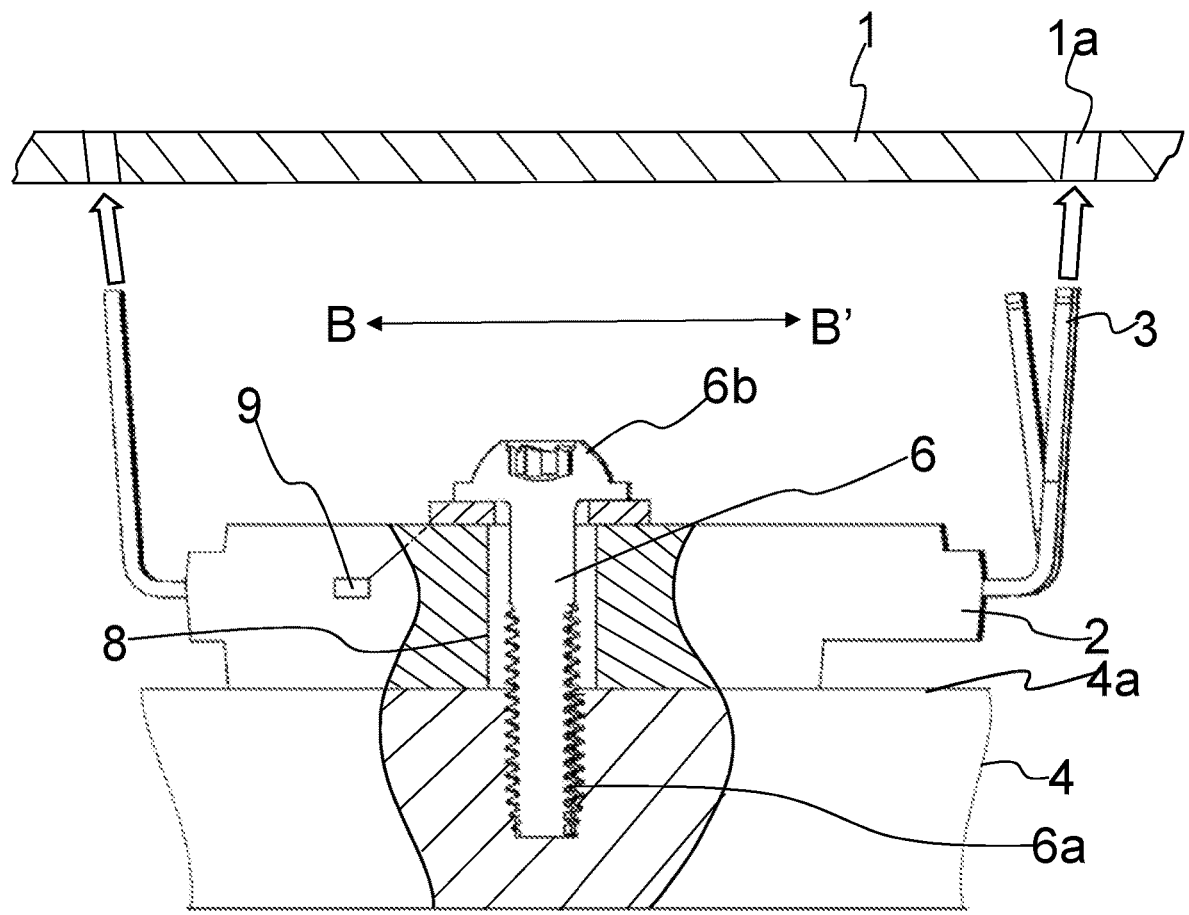
FIG. 1 illustrates a schematic representation of a mounting arrangement for mounting a power module on an end wall of a front head and thereafter connection between the power module and a PCB through lead frames in case of a conventional inverter unit.
Figure 2:
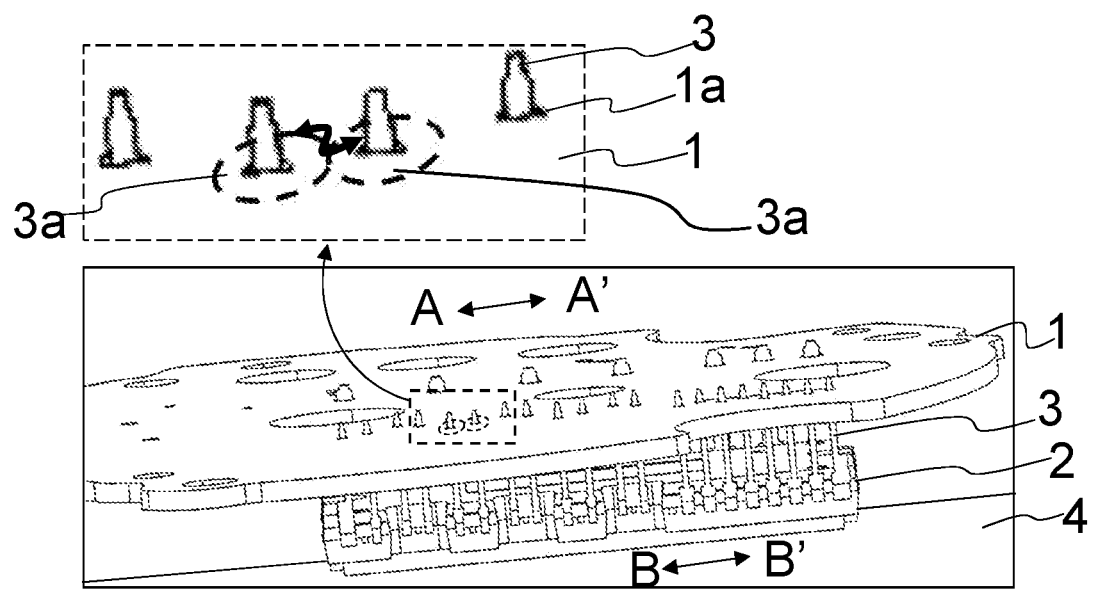
FIG. 2 illustrates enlarged view depicting lateral movement of the power module and the PCB of the conventional inverter unit of FIG. 1, also is depicted an enlarged view depicting problem of solder bridge between adjacent soldering sites.
Figure 3:
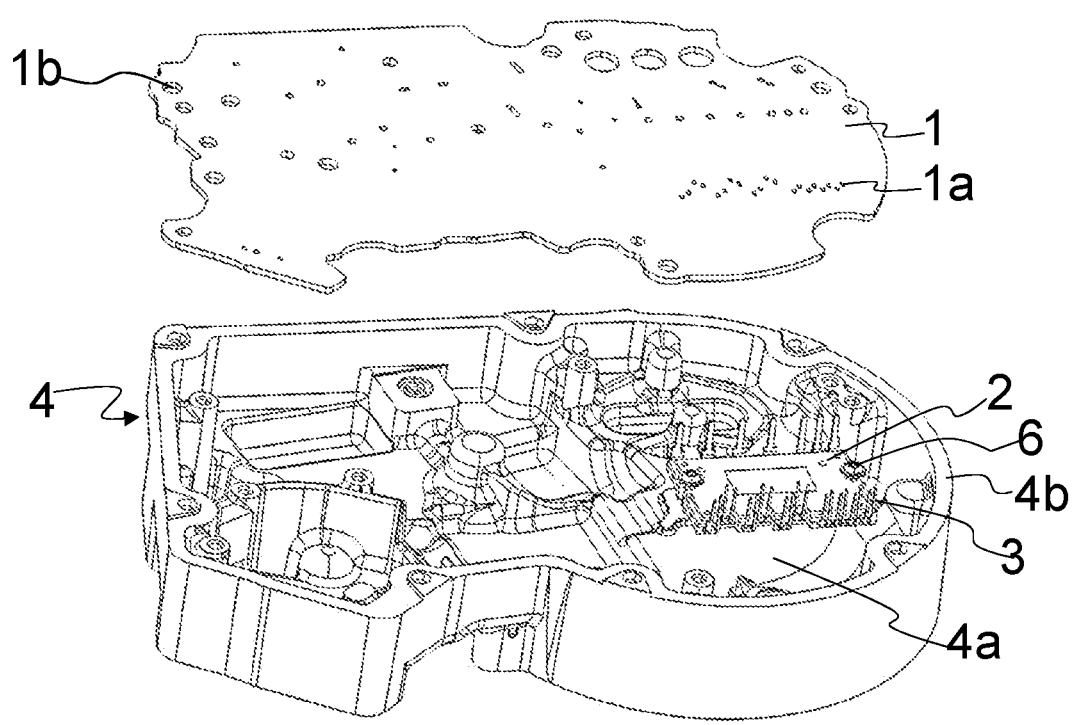
FIG. 3 illustrates an exploded view depicting mounting of the PCB over power module—front head sub-assembly of the conventional inverter unit of FIG. 1.

Also is disclosed a motor driven compressor 500 in accordance with an embodiment of the present invention. Again referring to the FIG. 2, the motor driven compressor 500 includes a compression unit 300, an electric motor 200 and an inverter unit 100. The compression unit 300 compresses fluid, particularly the refrigerant before the refrigerant is supplied to the condenser of the air conditioning loop. The electric motor 200 drives the compression unit 300. The inverter unit 100 as disclosed above drives the electric motor 200.

Obviously, numerous modifications and variations of the present invention are possible in light of the above teachings. It is therefore to be understood that the invention may be practiced otherwise than as specifically described herein.

We claim:

1. An inverter unit comprising:
   an inverter for driving an electric motor, the inverter comprising:
      at least one power module for converting a High Voltage (HV) Direct Current (DC) to a three-phase Alternating Current (AC) that drives the electric motor, the power module comprising lead frames emanating therefrom, and
      a printed circuit board configured with a plurality of electronic components mounted thereon and adapted to control the electric motor, the printed circuit board comprising apertures formed there-through and adapted to receive the corresponding lead frames;
   an inverter housing comprising a front head and a cover, the front head comprising an end wall and a peripheral wall, the cover in conjunction with the front head defines an enclosure for receiving the inverter,
   wherein a plurality of support elements are adapted to support the power module in a hanging configuration with respect to the printed circuit board to define a printed circuit board sub-assembly.

2. The inverter unit as claimed in claim 1, further comprising: a separator element of insulating material, assembled to underside of the printed circuit board facing the end wall of the front head to form the printed circuit board sub-assembly.

3. The inverter unit as claimed in the claim 2, wherein the separator element is adapted to separate the electronic components mounted on underside of the printed circuit board with respect to each other.

4. The inverter unit as claimed in the claim 2, wherein the separator element comprises at least one of apertures, passages and cut-outs aligned with apertures formed on the printed circuit board and adapted to permit passage of the lead frames there-through.

5. The inverter unit as claimed in claim 2, wherein the support elements are depending from the separator element and adapted to prevent the power module from falling into the front head during placing of the printed circuit board sub-assembly inside the front head.

6. The inverter unit as claimed in claim 2, wherein the support elements are emanating from the power module and extending towards the separator element to engage therewith.

7. The inverter unit as claimed in claim 2, wherein the power module comprises cut-outs that are aligned to second holes and passages formed on the printed circuit board and the separator element respectively to permit passage of bolts there-through for mounting the power module of the printed circuit board sub-assembly to the end wall.

8. The inverter unit as claimed in claim 1, wherein the support elements are depending from the printed circuit board and adapted to support the power module in a hanging configuration with respect to the printed circuit board.

9. The inverter unit as claimed in claim 1, wherein the support elements are emanating from the power module and extending towards the printed circuit board to engage therewith.

10. The inverter unit as claimed in claim 1, wherein the power module comprises cut-outs that are aligned to second holes formed on the printed circuit board to permit passage of bolts there-through for mounting the power module of the printed circuit board sub-assembly to the end wall.

11. The inverter unit as claimed in claim 1, wherein the power module comprises either one of a rib and a groove disposed either intermittently or continuously along at least a portion of periphery of the power module that engages with support elements.

12. The inverter unit as claimed in claim 1, wherein at least one of the support elements comprises a hook portion adapted to support the power module.

13. The method as claimed in the claim 12, further comprising: assembling a separator element of insulating material to under-side of the printed circuit board facing the end wall of the front head before receiving the lead frames emanating from the power module inside the corresponding apertures formed on the PCB.

14. The method as claimed in claim 13, wherein supporting the power module of the inverted printed circuit board sub-assembly comprises supporting the power module by the support elements depending from the separator element.

15. A motor driven compressor comprising:
   a compression unit adapted to compress fluid;
   an electric motor driving the compression unit; and
   an inverter unit as claimed in claim 1 and adapted to drive the electric motor.

16. A method of assembling an inverter unit comprising an inverter configured with a printed circuit board and a power module; and an inverter housing comprising a front head and a cover, the method comprising:
   inserting lead frames emanating from the power module into corresponding apertures formed on the printed circuit board to form a printed circuit board sub-assembly;
   inverting the printed circuit board sub-assembly so that the power module of the printed circuit board sub-assembly is in a hanging configuration thereof with respect to the printed circuit board;

simultaneously supporting the power module of the inverted printed circuit board sub-assembly by support elements;

placing of the inverted printed circuit board sub-assembly inside the front head of the inverter housing, wherein the support elements prevent the power module of the printed circuit board sub-assembly from falling over an end wall of the front head;

assembling the printed circuit board of the printed circuit board sub-assembly to the front head by means of screws passing through first holes formed on the printed circuit board;

securely mounting the power module of the printed circuit board sub-assembly to the end wall of the front head by means of bolts to urge the power module against the end wall;

forming soldering connection between the lead frames and the printed circuit board; and mounting the cover over the front head for closing an open end of the front head by means of screws.

17. The method as claimed in claim 16, wherein supporting the power module of the inverted printed circuit board sub-assembly comprises supporting the power module by the support elements depending from the printed circuit board.

\* \* \* \* \*